United States Patent [19]

Clarke

[11] Patent Number: 5,145,303
[45] Date of Patent: Sep. 8, 1992

[54] METHOD AND APPARATUS FOR REDUCING PARTICULATE CONTAMINATION IN PROCESSING CHAMBERS

[75] Inventor: John R. Clarke, Cary, N.C.

[73] Assignee: MCNC, Research Triangle Park, N.C.

[21] Appl. No.: 662,236

[22] Filed: Feb. 28, 1991

[51] Int. Cl.$^5$ .................................................. H01L 21/68
[52] U.S. Cl. .................................... 414/217; 414/786; 414/DIG. 5; 454/187
[58] Field of Search ................ 414/217, 222, DIG. 1, 414/DIG. 5; 98/115.3; 118/719; 204/298.25, 298.35, 198; 454/49, 187

[56] References Cited

U.S. PATENT DOCUMENTS

| | | | |
|---|---|---|---|
| 4,632,624 | 12/1986 | Mirkovich et al. | 414/217 |
| 4,643,627 | 2/1987 | Bednorz et al. | 414/217 |
| 4,676,144 | 6/1987 | Smith, III | 98/215.3 X |
| 4,687,542 | 8/1987 | Davis et al. | 414/217 X |
| 4,727,993 | 3/1988 | Mirkovich et al. | 211/41 |
| 4,781,511 | 11/1988 | Harada et al. | 414/217 |
| 4,842,680 | 6/1989 | Davis et al. | 204/298.35 X |
| 4,851,018 | 7/1989 | Lazzari et al. | 414/217 X |
| 4,867,629 | 9/1989 | Iwasawa et al. | 414/217 X |
| 4,904,153 | 2/1990 | Iwasawa et al. | 98/115.3 X |
| 4,927,438 | 5/1990 | Mears et al. | 98/115.3 X |
| 4,962,726 | 10/1990 | Matsushita et al. | 414/217 X |
| 4,976,815 | 12/1990 | Hiratsuka et al. | 98/115.3 X |
| 4,987,673 | 1/1991 | Kogura et al. | 98/115.3 X |
| 5,058,491 | 10/1991 | Wiemer et al. | 98/115.3 |

Primary Examiner—David A. Bucci
Attorney, Agent, or Firm—Bell, Seltzer, Park & Gibson

[57] ABSTRACT

A load lock removes particulate contamination during microelectronic manufacturing. The load lock may have a single door or two doors, or a single door and a funnel valve. A passageway is defined through the load lock when the door or doors, or the funnel valve, are opened. The particulate contamination is removed from the load lock by providing a laminar flow of gas through the passageway. The source for generating the laminar flow may be external to the load lock or internal to the load lock.

13 Claims, 4 Drawing Sheets

METHOD AND APPARATUS FOR REDUCING PARTICULATE CONTAMINATION IN PROCESSING CHAMBERS

FIELD OF THE INVENTION

This invention relates to processing chambers for microelectronic, optical or other device manufacturing, and more particularly to load locks for use in vacuum chamber processing of microelectronic substrates or other objects.

BACKGROUND OF THE INVENTION

An important concern during microelectronic manufacturing is minimization of particulate contamination. Efforts have been made to reduce particulate contamination resulting from exposure during the transfer of a microelectronic substrate into a processing chamber. One area of development centers on a load lock, which is a vessel that operates in conjunction with a process chamber for microelectronic substrate processing. The load lock provides an intermediary for transferring a substrate from normal atmospheric pressure to the evacuated processing chamber.

Conventional load locks for vacuum processing chambers typically include a door for substrate loading and unloading under atmospheric pressure. Small particulates generated by moving parts within the load lock are typically suspended in the load lock while the vessel is at atmospheric pressure. Gravity has little effect on such small particulates. The particulates exist throughout the entire volume of the conventional load lock and may attach themselves to substrates. The particulates can interfere with substrate processing and reduce the yield of the operation.

U.S. Pat. No. 4,632,624 to Mirkovich et al. entitled Vacuum Load Lock Apparatus and U.S. Pat. No. 4,727,993 to Mirkovich et al. entitled Wafer Cassette Having Multi-Directional Access describe load locks which reduce wafer exposure to particulates during processing. Both patents disclose an upper and lower bell jar, the lower bell jar being removable from the assembly for the disposal of broken wafer pieces. The lower removable bell jar permits disposal of particulates to reduce particulate contamination. Unfortunately, many particulates are suspended in the load lock air and are unaffected by gravity, so that the removal of the lower bell jar does not remove these particulates.

U.S. Pat. No. 4,687,542 to Davis et al. entitled Vacuum Processing System and U.S. Pat. No. 4,842,680 to Davis et al. entitled Advanced Vacuum Processor both disclose a vacuum processing system including a load lock. Once the wafers have been inserted into the load lock and the load lock door is closed, a high pressure purge is applied through a manifold located on the inside of the load lock door. This high pressure purge provides a vertical flow to displace particles in a downward direction and also helps to blow off some of the large particles which have collected on the wafer carrier during its exposure to atmospheric conditions. The particles come to rest on the bottom of the load lock chamber. The chamber is then slowly evacuated in order not to aggravate the particles displaced on the bottom of the chamber.

The Davis et al. patents do not remove particulate contaminants from the load lock, but rather rely upon forcing the particulates to the bottom of the chamber and settling of particulates at the bottom of the chamber. Slow evacuation and lack of movement must occur in order not to disturb particulates on the chamber bottom. Unfortunately, some disturbance will always occur. Moreover, even without a disturbance, lightweight particulates will not all settle on the bottom, or remain on the bottom. Accordingly, only incomplete removal of particulates is accomplished.

SUMMARY OF THE INVENTION

It is therefore an object of the present invention to provide an improved load lock method and apparatus for use in processing microelectronic substrates.

It is a further object of the present invention to provide a method and apparatus for reducing the level of particulate contamination during the processing of microelectronic substrates.

The present invention provides effective removal of particulate material from a load lock chamber by providing a laminar gas flow through the load lock chamber, before the chamber is sealed. The laminar flow removes particulate contamination from the chamber, thereby increasing the manufacturing yield of microelectronic devices.

A number of embodiments for providing laminar flow through the load lock are provided according to the present invention. In one embodiment, the load lock chamber includes two doors which seal the load lock chamber in their closed position. One door is located on the top of the load lock and the second is located on the bottom of the load lock. The doors can be opened to define a passageway through the load lock chamber. A laminar gas flow is provided through this passageway to remove the particulate contamination from the chamber. Once the laminar gas flow has removed particulate contaminants from the load lock chamber, the doors are closed to seal the chamber and permit contamination-free microelectronic manufacturing.

In an alternative embodiment, the load lock chamber also has two doors, the first of which is located on the top of the load lock and the second of which is located on the side of the load lock. The doors define a passageway through the chamber when in the open position. A laminar gas flow is provided through the top door and is diverted to exit the chamber through the side door by a diverter located at the bottom of the load lock chamber. Once the laminar gas flow has removed particulate contaminants from the load lock chamber, the doors are closed to seal the chamber and permit contamination-free microelectronic manufacturing.

Another alternative embodiment of the present invention provides a load lock chamber having one door, which may be located on the side of the chamber, and which defines a passageway for removal of contaminants from the chamber. A manifold located inside the load lock wall opposite the door provides a source for producing the laminar gas flow. The gas from the manifold flows in a laminar fashion through the chamber and exits by way of the open door to remove particulate contamination from the chamber. Once the laminar gas flow has removed particulate contaminants from the load lock chamber, the door is closed to seal the chamber and permit contamination-free microelectronics manufacturing.

A further alternative embodiment of the present invention provides a load lock chamber having one door, which may be located on the top of the chamber, and a funnel shaped wall which may be located on the bottom of the chamber. A manifold located inside the door provides a source for producing the laminar gas flow. The laminar gas flow from the manifold exits by way of a funnel valve in the funnel shaped wall to remove particulate contamination from the chamber. The funnel shaped wall helps direct particulates to the funnel valve and a suction pump, attached to the funnel valve, enhances the laminar gas flow. Once the laminar gas flow has removed particulate contaminates from the load lock chamber, the funnel valve is closed to seal the chamber and permit contamination free microelectronics manufacturing.

All four embodiments provide a laminar flow in the load lock chamber to remove particulate contamination without relying on the haphazard effect of gravity, to permit contamination-free microelectronic manufacturing. Additional features and aspects of the present invention will be evident from the detailed description which follows, and from the accompanying drawings.

DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

Figure 1:
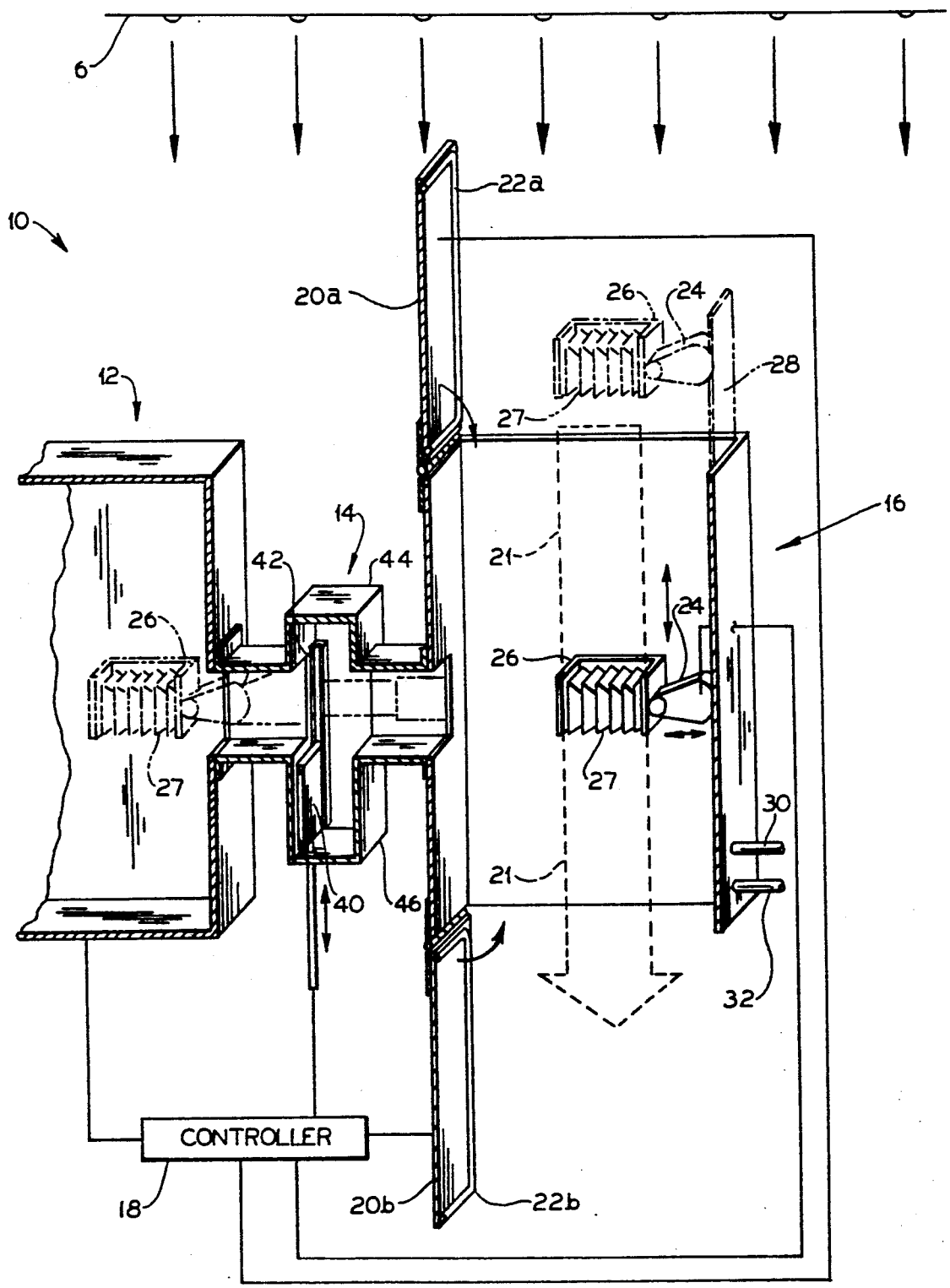
FIG. 1 schematically illustrates a microelectronic manufacturing apparatus having a load lock with a top and bottom door and a clean room ceiling for generating a laminar air flow according to the present invention.

Referring to FIG. 1, a microelectronic manufacturing apparatus is illustrated generally at 10. The apparatus has three components: a processing Chamber 12, a gate valve 14 and a load lock chamber 16. The load lock chamber of the present invention permits microelectronic manufacturing in a contamination-free environment by removing particulate contamination prior to manufacturing microelectronic components in the processing chamber.

In particular, load lock chamber 16 includes two doors, 20a and 20b, respectively, which define a passageway, shown by arrow 21, through the load lock chamber When in the open position. Doors 20a and 20b seal load lock chamber 16 when closed. Load lock doors 20a, 20b may be provided with o-ring seals 22a, 22b to seal the chamber. Alternatively, pairs of o-rings with an evacuated space between them may be provided to enhance the sealing of load lock chamber 16.

Robot arm 24 moves substrate tray 26 which holds substrates or wafers 27, into the load lock chamber and subsequently from the load lock chamber 16 into processing chamber 12 for microelectronics manufacturing. Substrate tray 26 is typically about two hundred eighty eight (288) cubic inches in volume and load lock 16 is typically about two (2) cubic feet in volume to accommodate the robot arm and the tray. The load lock is preferably manufactured from aluminum or stainless steel. Guide track 28 permits robot arm 24 to move up and down within load lock 16 to permit loading of substrates onto tray 26 from the external environment, and movement of the substrates into the load lock for removal of particulate contamination and ultimately transfer into processing chamber 12 via gate valve 14.

In operation, doors 20a and 20b of load lock chamber 16 are opened. Robot arm 24 is raised along guide track 28 to permit placement of substrate 27 in tray 26 or to permit attachment of a tray containing substrates to robot arm 24. Robot arm 24 then moves downward along guide track 28 into load lock chamber 16. Open doors 20a and 20b define a passageway 21 through load lock chamber 16. A laminar air flow is generated through passageway The air flow is preferably between 70 and 110 linear feet per minute. The shape of the passageway permits the air flow therethrough to be laminar so that particulate contamination is removed from chamber 16.

In a preferred embodiment, the laminar air flow is generated by the clean room in which the microelectronic manufacturing apparatus is placed. In this embodiment, as illustrated in FIG. 1, the ceiling 6 of the clean room produces a laminar flow of HEPA (high efficiency particulate air) or ULPA (ultra low penetration air) filtered air (illustrated by arrows), which generates a laminar air flow through passageway 21 of load lock 16. In an alternative embodiment, illustrated in FIG. 2, an air duct 8, external to the load lock, is located directly above load lock 16. The external air duct generates a laminar flow of air through passageway 21 which removes particulate contamination from the load lock chamber. Laminar air flow through passageway 21 is typically maintained for about one minute, to allow flushing of contaminants from the load lock.

Once the particulate contamination has been removed from the load lock by flushing the load lock with the laminar air flow, load lock doors 20a and 20b are closed thereby sealing load lock 16. O-rings 22a and 22b ensure the sealing of the chamber. Preferably, top door 20a is closed prior to bottom door 20b. Once doors 20a and 20b have been closed, atmospheric pressure is purged or evacuated from the load lock via evacuating valve 30 attached to a vacuum pump (not shown) to create a vacuum. The substrates are then transferred into processing chamber 12 via gate valve 14 by robot arm 24 for microelectronic manufacturing as described below.

Once processing is complete, the substrates are removed from the processing chamber via gate valve 14 by robot arm 24. Load lock chamber 16 is then returned to atmospheric pressure Via valve 32. Valve 32 may be connected to a nitrogen or other gas source (not shown) to facilitate returning the load lock to atmospheric pressure. Once returned to atmospheric pressure, doors 20b and 20a are opened, preferably in that order, and the substrates are removed from the load lock by the robot arm 24. Additional substrates may then be placed on tray 26 for microelectronics manufacturing or a new tray 26 may be substituted and the process is repeated.

Gate valve 14 is a standard gate valve available from a number of manufacturers including Varian, HPS or VAT. The gate valve door 40, located inside gate valve 14, is closed during operation of load lock 16, thereby sealing the gate valve. Gate valve door 40 may have o-ring seals (not shown) similar to o-ring seals 22 on load lock doors 20 to insure the sealing of the gate valve 14. Once load lock 16 has been evacuated, gate valve door 40 is opened as illustrated in FIG. 1. Robot arm 24 then extends through the open gate valve thereby transferring the wafers 27 in wafer tray 26 into processing chamber 12. Robot arm 24 may then retract, leaving the substrates in the processing chamber. Gate valve door 40 is then closed thereby sealing processing chamber 12 to permit microelectronics manufacturing. Gate valve door 40 slides on gate valve track 42 to permit opening and closing of the gate valve. The upper portion 44 of gate valve 14 is provided to accommodate the top of gate valve door 40 when in the closed position and the lower portion 46 of the gate valve is provided to accommodate the entire gate valve door when in the open position.

Processing chamber 12 is a typical microelectronics processing chamber such as those manufactured by Varian, MRC, Leybold or Anelva. The processing chamber may at all times be maintained under vacuum or processing conditions by the gate valve which seals the chamber.

Controller 18 preferably controls the operation of the microelectronics manufacturing apparatus including the load lock 16, gate valve 14 and processing chamber 12, although it will be understood by those having skill in the art that manual control may also be provided. In operation, controller 18 controls robot arm 24 to obtain substrates from the external environment, and to move substrates into load lock 16, with load lock doors 20a and 20b remaining open. A laminar flow of gas, generated by the Ceiling 6 (FIG. 1) of the clean room or an external air duct 8 (FIG. 2) over the load lock, is directed through passageway 21 thereby removing particulate contamination from the load lock. The laminar air flow preferably ranges from 70 to 110 linear feet per minute. In order to remove particulates, the load lock doors may remain open for about 1 minute. Controller 18 then closes door 20a and subsequently closes door 20b. Atmospheric pressure is then evacuated from load lock 16 via vacuum valve 30 attached to a vacuum pump (not shown) under control of controller 18.

Once load lock 16 is evacuated, controller 18 causes gate valve door 40 to be opened and extends robot arm 24 through the open gate valve thereby transferring substrates 27 held in tray 26 into processing chamber 12. Robot arm 24 is then retracted into the load lock chamber and the gate valve door is closed. The substrates are processed in processing chamber 12 under control of controller 18.

Once processing is complete, processing chamber 12 is evacuated and the gate valve is opened. Robot arm 24 retrieves the processed substrates from the processing chamber and returns them to the load lock chamber. The gate valve is closed and the load lock is returned to atmospheric pressure via valve 32. Load lock door 20b is then opened followed by load lock door 20a. The substrates are then removed from load lock chamber 16 by raising the robot arm under control of controller 18 to permit retrieval of the substrates from the tray.

Figure 2:
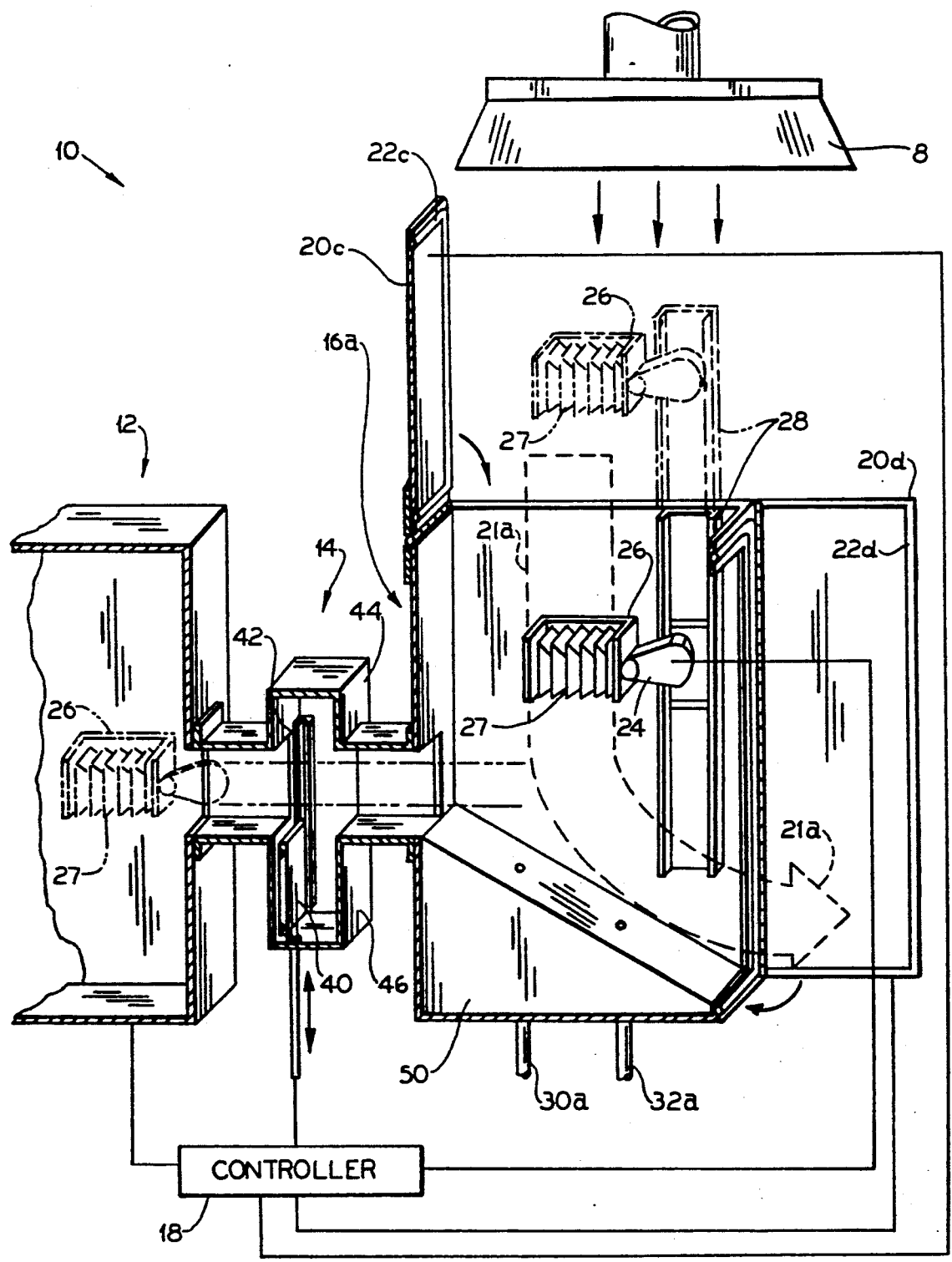
FIG. 2 schematically illustrates a microelectronic manufacturing apparatus having a load lock with a top and a side load lock door and an external air duct for generating a laminar air flow through the load lock according to the present invention.

Referring to FIG. 2, an alternative embodiment of the present invention will now be described. This embodiment provides a load lock chamber 16a having two doors 20c and 20d which are located on the top and on the side of the load lock. Operation of the load lock is similar to that described with the embodiment illustrated in FIG. 1 with one exception: the passageway 21a through load lock 16a is defined by load lock doors 20c and 20d and is curved. Diverter 50 located in the bottom of load lock 16a and extending from the bottom of the gate valve opening into the load lock chamber to the bottom of door 20d diverts the flow of gas or air through the load lock to thereby enhance the laminar gas flow through the curved passageway 21a. Also as shown in FIG. 2, an external air duct 8, separate from the ceiling of the clean room, generates the laminar flow of air. It will be understood by those having skill in the art that the clean room ceiling laminar air flow may also be used.

Figure 3:
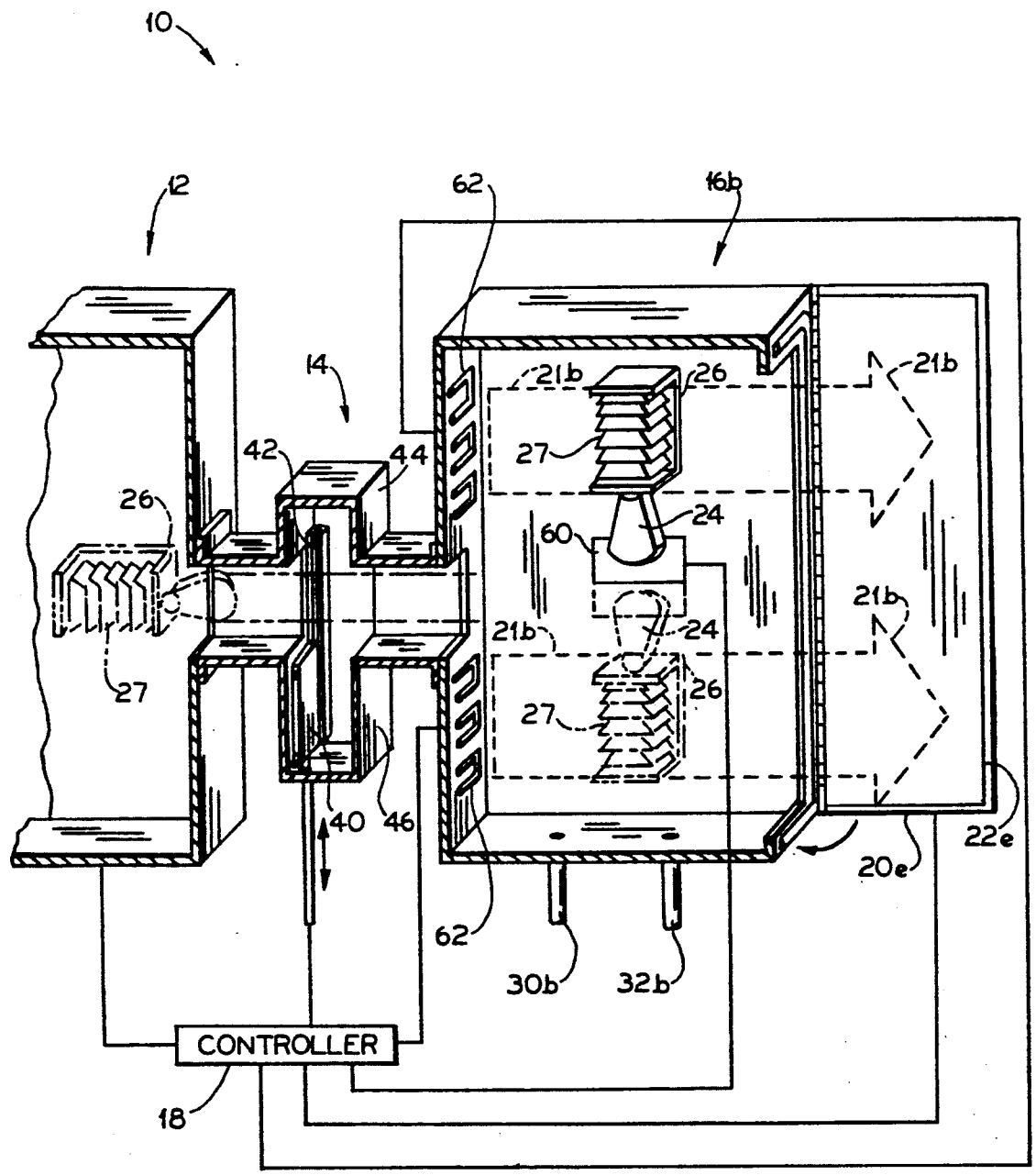
FIG. 3 schematically illustrates a microelectronic manufacturing apparatus having a load lock with a single door and a manifold attached to the interior of the load lock to generate a laminar air flow through the load lock according to the present invention.

Referring to FIG. 3, another alternative embodiment will now be described. Load lock 16b has a single access door 20e for wafer insertion and removal and for removal of particulate contamination. Load lock door 20e is preferably located on the side of load lock 16b and is opened and closed under control of controller 18. Guide track 28 has been replaced by pivot unit 60 to permit robot arm 24 to pivot wafer tray 26 into and out of load lock 16b via load lock door 20e. Evacuating valve 30 and valve 32 of the previous embodiments have been relocated to the bottom of the chamber as indicated at 30b and 32b respectively. Manifold 62 is provided for generating a laminar gas flow through passageway 21b created by load lock 16b and door 20e in the open position.

In operation, substrates 27 are placed onto tray 26 and transferred into load lock 16b by robot arm 24 as permitted by pivot unit 60. A laminar air flow through the passageway 21b, defined by load lock 16b and open door 20e, is generated by manifold 62. The laminar air flow removes particulate contamination from the load lock chamber. The laminar flow is preferably about 70 to 110 linear feet per minute. Once particulate contamination has been removed from the load lock, controller 18 stops the flow of gas or air from manifold 62 and closes load lock door 20e, thereby sealing load lock 16b. The operation of the load lock in combination with the gate valve 14 and processing chamber 12 continues as previously described. It will be understood by those skilled in the art that the load lock door 20e may be placed at different locations on load lock chamber 16b, including at the bottom of 16b. Manifold 62 is preferably placed on the interior wall of load lock 16b opposite that of door 20.

Figure 4:
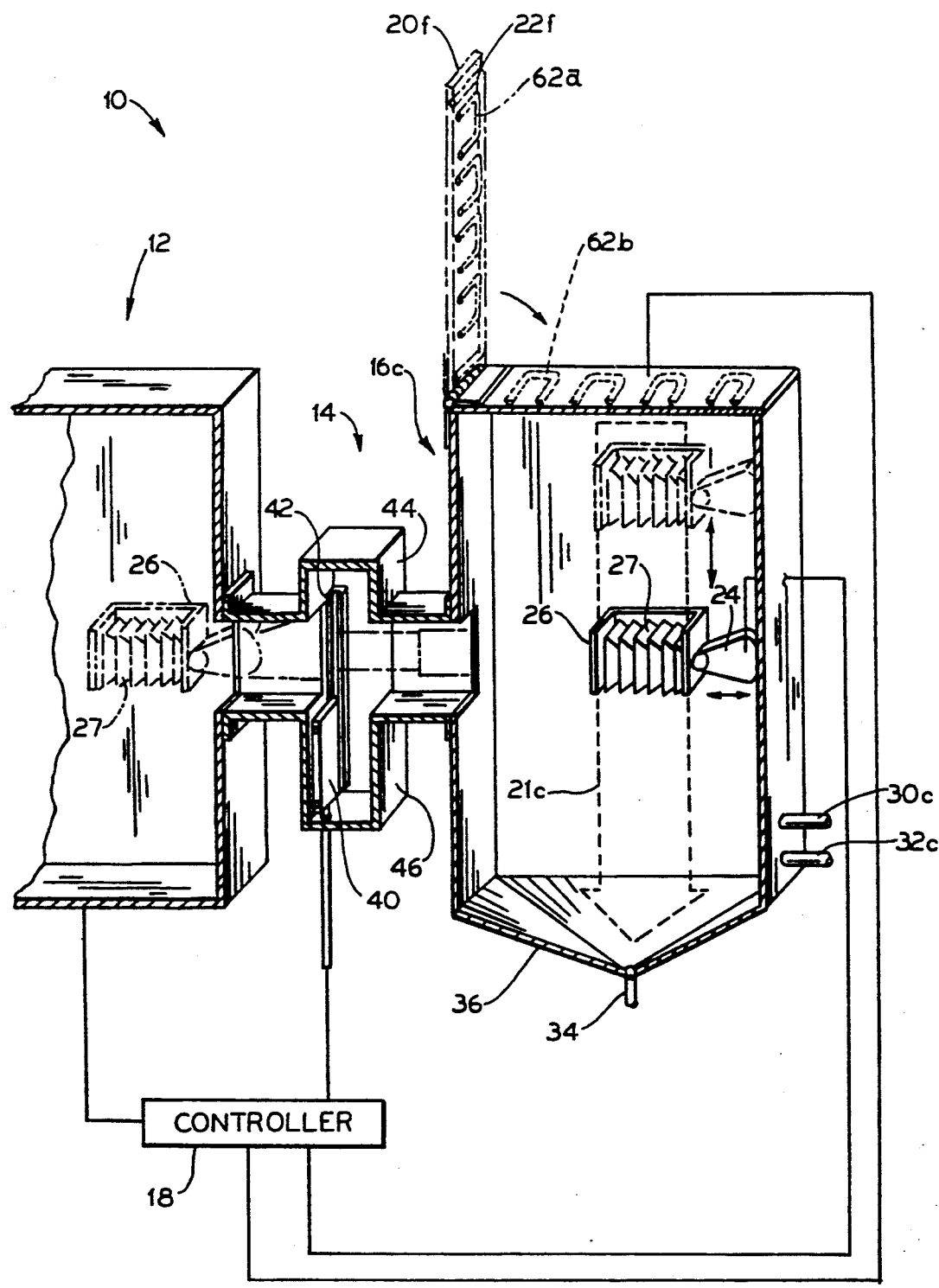
FIG. 4 schematically illustrates a microelectronics manufacturing apparatus having a manifold attached to the interior of the load lock and a funnel shaped wall with a funnel valve opposite the manifold to generate a laminar air flow through the load lock according to the present invention.

Referring to FIG. 4, a further alternative embodiment will now be described. The load lock 16c has a single access door 20f for wafer insertion and removal. Load lock door 20f is preferably located on the top of load lock 16c and is opened and closed under control of controller 18. Manifold 62a, preferably located on the interior of load lock door 20f, generates a laminar air flow. Funnel shaped wall 36, located opposite manifold 62a, directs the laminar air flow to funnel valve 34 through which particulate contaminates are removed. Funnel valve 34 is attached to a suction pump (not shown) to assist in the removal of the particulate contaminates.

In operation, load lock door 20f of load lock 16c is opened. Robot arm 24 is raised along a guide track (not shown) to permit placement of substrate 27 in tray 26 or to permit attachment of a tray containing substrates to robot arm 24. Robot arm 24 then moves downward along the guide track into load lock chamber 16c. Load lock door 20f is closed thereby sealing the top of the load look chamber. O-ring seal 22f helps seal the top of the chamber while load lock door 20f is in the closed position.

Funnel valve 34, attached to a suction pump (not shown), is opened. A laminar air flow through passageway 21c, defined by load lock 16c, is generated by manifold 62a. The laminar air flow passes across substrates 27 removing particulate contamination from tray 26 and through funnel valve 34. The funnel wall 36 assists in directing the particulate contamination through funnel valve 34. The suction pump helps draw particulates from the load lock.

Once particulate contamination has been removed from load lock 16c, controller 18 stops the flow of gas or air from manifold 62a and closes funnel valve 34, thereby sealing load lock 16c. The operation of the load lock in combination with the gate valve 14 and processing chamber 12 continues as previously described. It will be understood by those skilled in the art that the load lock door 20f may be placed at different locations on the load lock chamber 16c, including at the side of 16c. Manifold 62a is preferably placed on the interior wall of load lock 16c opposite that of funnel wall 36 containing funnel valve 34.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An apparatus for transferring objects to and from a processing chamber comprising:
   a load lock chamber, adapted for connection to a processing chamber;
   means for moving an object from said load lock chamber to a processing chamber;
   first and second sealing means mounted on said load lock chamber, said first and second sealing means being movable between open and closed positions, for sealing said load lock chamber in the closed position and for defining a passageway through said chamber in the open position; and
   means for generating a laminar gas flow through the passageway;
   whereby particulate contamination is removed from the passageway by the laminar gas flow.

2. The apparatus of claim 1 further comprising a gate valve having a gate valve sealing means, said gate valve sealing means being movable between open and closed positions, for sealing the processing chamber in the closed position and for defining a gate valve passageway through which an object is moved between said load lock chamber and the processing chamber.

3. The apparatus of claim 1 wherein said moving means comprises a robotic arm for moving an object into and out of the processing chamber.

4. The apparatus of claim 1 wherein said generating means comprises a source of laminar gas flow external to said load lock chamber for generating a laminar gas flow through the passageway.

5. The apparatus of claim 4 wherein said load lock chamber is mounted in a clean room having a ceiling and a floor, and having a laminar air flow from the clean room ceiling to the clean room floor, and wherein said external source comprises the laminar air flow from the clean room ceiling to the clean room floor.

6. The apparatus of claim 5 wherein said external source comprises an external air duct for generating a luminar gas flow through the passageway.

7. The apparatus of claim 1 further comprising means for evacuating the load lock chamber and for returning said load lock chamber to atmospheric pressure.

8. The apparatus of claim 1 further comprising a controller for electronically controlling said moving means and said generating means.

9. The apparatus of claim 1 in combination with a processing chamber, said load lock chamber being connected to said processing chamber; said moving means moving an object from said load lock chamber to the connected processing chamber.

10. A method for removing particulate contamination from a load lock chamber, having a top side and a bottom side, and located in a clean room having laminar gas flow from the clean room ceiling to the clean room floor, said method comprising the steps of:
    placing an object in the load lock chamber;
    opening at least the top side of the load lock chamber, to admit the laminar gas flow from the clean room ceiling into the load lock chamber to remove particulate contaminants from the load lock chamber; and
    sealing the load lock chamber to permit contaminant-free processing of the object.

11. The method of claim 10 further comprising the steps of:
    moving the object from the load lock chamber into a processing chamber;
    processing the object inside the processing chamber;
    moving the processed object from the processing chamber to the load lock chamber;
    unsealing the load lock chamber; and
    removing the object from the load lock chamber.

12. The method of claim 10 wherein said laminar gas flow is a straight laminar gas flow.

13. The method of claim 10 wherein said laminar gas flow originates outside said load lock chamber.

* * * * *

UNITED STATES PATENT AND TRADEMARK OFFICE
CERTIFICATE OF CORRECTION

PATENT NO. : 5,145,303
DATED : September 8, 1992
INVENTOR(S) : Clarke

It is certified that error appears in the above-identified patent and that said Letters Patent is hereby corrected as shown below:

Column 3, line 57, "Chamber" should be --chamber--.

Column 3, line 67, "When" should be --when--.

Column 4, line 27, after "passageway", please insert --21.--.

Column 4, line 65, "Via" should be --via--.

Column 5, line 42, "Ceiling" should be --ceiling--.

Column 7, line 8, "look" should be --lock--.

Column 7, lines 39 and 40, "1." should appear on the same line with text of Claim 1.

Column 8, line 18, "5" should be --4--.

Signed and Sealed this

Fourteenth Day of September, 1993

Attest:

BRUCE LEHMAN

*Attesting Officer*                *Commissioner of Patents and Trademarks*